(12) United States Patent
King et al.

(10) Patent No.: US 9,601,234 B2
(45) Date of Patent: Mar. 21, 2017

(54) THREE-DIMENSIONAL (3D) POROUS DEVICE AND METHOD OF MAKING A 3D POROUS DEVICE

(75) Inventors: William P. King, Champaign, IL (US); Paul V. Braun, Savoy, IL (US); Zhenting Dai, Chandler, AZ (US); Xindi Yu, Urbana, IL (US); Hui Gang Zhang, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 13/978,453

(22) PCT Filed: Jan. 6, 2011

(86) PCT No.: PCT/US2011/020301
§ 371 (c)(1),
(2), (4) Date: Sep. 11, 2013

(87) PCT Pub. No.: WO2012/094006
PCT Pub. Date: Jul. 12, 2012

(65) Prior Publication Data
US 2014/0011014 A1    Jan. 9, 2014

(51) Int. Cl.
| | | |
|---|---|---|
| *C25D 5/02* | (2006.01) | |
| *C25D 5/48* | (2006.01) | |
| *C25D 7/00* | (2006.01) | |
| *H01B 5/14* | (2006.01) | |

(Continued)

(52) U.S. Cl.
CPC ................ *H01B 5/14* (2013.01); *B05D 5/12* (2013.01); *B81C 1/00031* (2013.01); *C25D 5/02* (2013.01); *C25D 5/48* (2013.01); *C25D 7/00* (2013.01); *B81B 2203/0353* (2013.01); *Y10T 428/249967* (2015.04)

(58) Field of Classification Search
CPC ............... C25D 5/02; C25D 5/48; C25D 7/00
USPC ........................................................ 205/221
See application file for complete search history.

(56) References Cited

U.S. PATENT DOCUMENTS

| | | |
|---|---|---|
| 6,680,013 B1 | 1/2004 | Stein et al. |
| 7,745,249 B2 | 6/2010 | Lee et al. |
| 8,237,538 B2 | 8/2012 | Braun et al. |

(Continued)

OTHER PUBLICATIONS

Atwater, H.A., et al., "Plasmonics for improved photovoltaic devices", Nature Materials, 2010, vol. 9., 205-213.*

(Continued)

*Primary Examiner* — Stefanie S Wittenberg
(74) *Attorney, Agent, or Firm* — Brinks Gilson & Lione (57) ABSTRACT

A method of making a three-dimensional porous device entails providing a substrate having a conductive pattern on a surface thereof, and depositing a colloidal solution comprising a plurality of microparticles onto the surface, where the microparticles assemble into a lattice structure. Interstices of the lattice structure are infiltrated with a conductive material, which propagates through the interstices in a direction away from the substrate to reach a predetermined thickness. The conductive material spans an area of the surface overlaid by the conductive pattern. The microparticles are removed to form voids in the conductive material, thereby forming a conductive porous structure having the predetermined thickness and a lateral size and shape defined by the conductive pattern.

16 Claims, 12 Drawing Sheets

(51) Int. Cl.
  *B05D 5/12* (2006.01)
  *B81C 1/00* (2006.01)

(56) References Cited

U.S. PATENT DOCUMENTS

| | | |
|---|---|---|
| 2004/0195096 A1 | 10/2004 | Tsamis et al. |
| 2008/0246580 A1* | 10/2008 | Braun et al. ............ 338/20 |
| 2008/0261297 A1 | 10/2008 | Chaffey et al. |
| 2010/0068623 A1 | 3/2010 | Braun et al. |

OTHER PUBLICATIONS

Kuo et al., "Fabrication of Patterned Inverse Opal Structure Through Physical Confinement Assembly and Selective Electrochemical Deposition", J. Am. Ceram. Soc., 90, 1956-1958, 2007.*
International Search Report for International PCT Application No. PCT/US2011/020301, mailing date Aug. 30, 2011, pp. 1-4.
Braun, P.V. et al., "Electrochemical Fabrication of 3D Microperiodic Porous Materials," *Adv. Mater.* 13, 7 (2001) pp. 482-485.
Braun, P.V. et al., "Electrochemically Grown Photonic Crystals," *Nature* 402 (1999) pp. 603-604.
El-Hallag, I.S., "Characterization of Electrodeposited Nanostructured Macroporous Cobalt Films Using Polystyrene Sphere Templates," *Material Science-Poland* 28, 1 (2010) pp. 245-253.
Johnson, S., "Photonic Crystals: Periodic Surprises in Electromagnetism," *IAP Tutorial Series* (2003) pp. 1/1-15.
Lai, M. et al., "Templated Electrosynthesis of Nanomaterials and Porous Structures," *Journal of Colloid and Interface Science* 323 (2008) pp. 203-212.
Lee, C. et al., "Optical Nanomechanical Sensor Using a Silicon Photonic Crystal Cantilever Embedded with a Nanocavity Resonator," *Applied Optics* 48, 10 (2009) pp. 1797-1803.
Lee, J-H. et al., "Density-Controlled Growth and Field Emission Property of Aligned ZnO Nanorod Arrays," *Appl. Phys. A* 97 (2009) pp. 403-408.
Li, X.V. et al., "Fabrication of Plasmonic Au Nanovoid Trench Arrays by Guided Self-Assembly," *Nanotechnology* 20, (2009) pp. 1-9.
Yu, X. et al., "Filling Fraction Dependent Properties of Inverse Opal Metallic Photonic Crystals," *Adv. Mater.* 19 (2007) pp. 1689-1692.

* cited by examiner

THREE-DIMENSIONAL (3D) POROUS DEVICE AND METHOD OF MAKING A 3D POROUS DEVICE

FEDERALLY SPONSORED RESEARCH OR DEVELOPMENT

This subject matter of this application has been funded by the Air Force Office of Scientific Research under Grant No. A3718 AF FA9550-08-1-0407. The U.S. Government may have rights in this invention.

RELATED APPLICATION

The present patent document is the national stage of International Patent Application PCT/US2011/020301, filed on Jan. 6, 2011, which is hereby incorporated by reference.

TECHNICAL FIELD

This disclosure is related generally to microelectromechanical system (MEMS) devices, and more particularly to micromechanical devices having a three-dimensional porous structure.

BACKGROUND

Porous solids with tailored pore characteristics have attracted considerable attention because of their novel optical, catalytic, sensing, and electrochemical properties. Exemplary solids having a periodic pore structure include photonic crystals and photonic bandgap materials, while separation membranes, mesoporous molecular sieves, and three-dimensionally (3D) porous metals may or may not require a periodic pore structure. Porous metals in particular are widely used in energy conversion or storage devices, as filters, as catalyst supports, as electromagnetic wave absorbers, and as biomedical scaffold materials.

Metallic photonic crystals, metal based structures with periodicities on the scale of the wavelength of light, are of commercial interest due to the potential for new properties, including the possibility of a complete photonic band gap with reduced structural constraints compared to purely dielectric photonic crystals, unique optical absorption and thermally stimulated emission behavior, and interesting plasmonic physics. Photonic band gap materials exhibit a photonic band gap, analogous to a semiconductor's electronic band gap, that suppresses propagation of certain frequencies of light, thereby offering photon localization or inhibition of spontaneous emissions. Such materials are described in Braun et al., "Variably Porous Structures," U.S. Patent Application Publication 2008/0246580, and in Braun et al., "Porous Battery Electrode for a Rechargeable Battery and Method of Making the Electrode," U.S. Patent Application Publication 2010/0068623, which are hereby incorporated by reference in their entirety.

Cantilever probes are employed in atomic force microscopy (AFM), infrared (IR) spectroscopy, and other sensing methods for surface characterization and spectroscopic studies. In many such techniques, attaining a higher signal-to-noise ratio is an ongoing goal. Microcantilevers are also used as actuators, switches, resonators, filters, force sensors, and displacement sensors in applications including telecommunications, timekeeping, navigation, and precision measurements. As a result, researchers have been developing new dimensions and shapes for cantilever probes in an effort to optimize the properties and performance of the devices.

The inventors have recognized that a new approach to the design and fabrication of such micromechanical devices is needed.

BRIEF SUMMARY

Disclosed herein is a method of making three-dimensional (3D) porous devices which may be employed for surface characterization, spectroscopy, and other applications. The 3D porous devices may have a tunable volume fraction of porosity and an ordered or disordered lattice structure that endow the devices with unique optical and mechanical properties. In some cases, the 3D porous devices may be suitable for photonic applications.

The method entails providing a substrate having a conductive pattern on a surface thereof, and depositing a colloidal solution comprising a plurality of microparticles onto the surface, where the microparticles assemble into a lattice structure. Interstices of the lattice structure are infiltrated with a conductive material, which propagates through the interstices in a direction away from the substrate to reach a predetermined thickness. The conductive material spans an area of the surface overlaid by the conductive pattern. The microparticles are removed to form voids in the conductive material, thereby forming a conductive porous structure having the predetermined thickness and a lateral size and shape defined by the conductive pattern.

An exemplary three-dimensional porous device comprises a molded three-dimensional framework of interconnected hollow particles, the particles comprising a periodic arrangement.

DETAILED DESCRIPTION

Materials having a regular and in some cases disordered three-dimensional (3D) microstructure are of great interest for their novel optical properties, particularly for application as photonic crystals. Described here are the first micromechanical devices made from a three-dimensional (3D) photonic crystal (PC) structure. Such devices may exhibit unique and/or enhanced mechanical, thermal, and/or infrared properties. Exemplary devices include nickel or aluminum oxide microcantilevers having a regular 3D inverse opal microstructure.

Figure 1A:
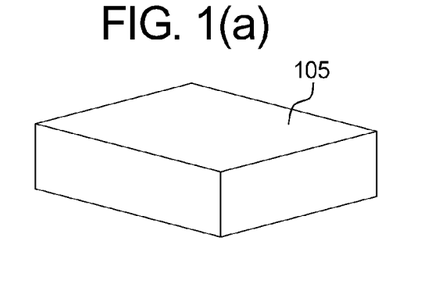
FIGS. 1(a)-1(h) are schematics showing steps of an exemplary fabrication process to create a porous cantilever device.
Figure 1B:
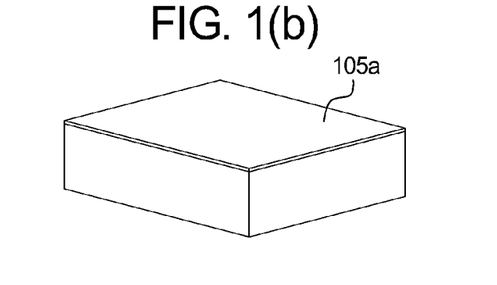
Figure 1C:
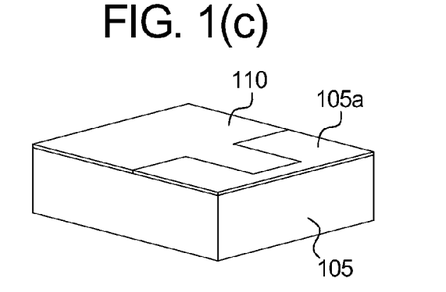
Figure 1D:
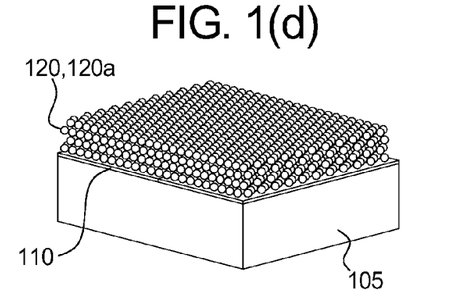

FIGS. 1(a)-1(h) and 2(a)-2(d) are schematics showing steps of a fabrication process to create an exemplary porous micromechanical device. The process is summarized first and then each step is described in greater detail. Referring to FIGS. 1(a)-1(c), a conductive pattern 110 is formed on a surface 105a of a substrate 105 using photolithography or another patterning method. A colloidal solution 115 comprising a plurality of microparticles 120a is deposited onto the surface 105a, and the microparticles 120a assemble into a lattice structure 120 (e.g., a face centered cubic (FCC) opal lattice), as shown schematically in FIG. 1(d) and FIG. 2(a). The lattice structure may be ordered (periodic) or disordered.

Figure 1E:
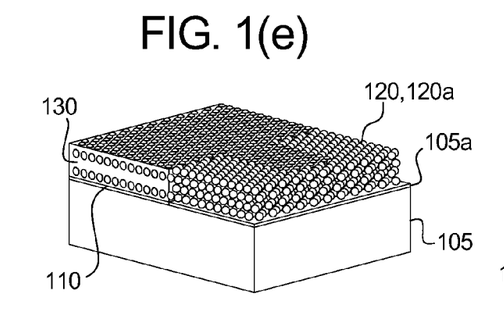
Figure 2A:
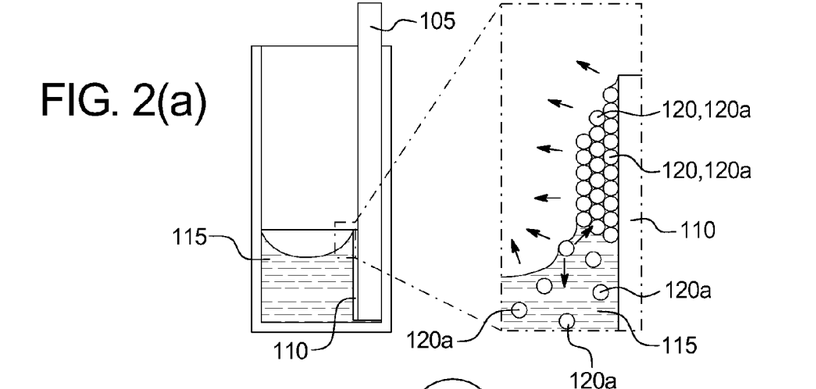
FIGS. 2(a)-2(d) are schematics showing steps of an exemplary fabrication process to create a porous micromechanical device.
Figure 2B:
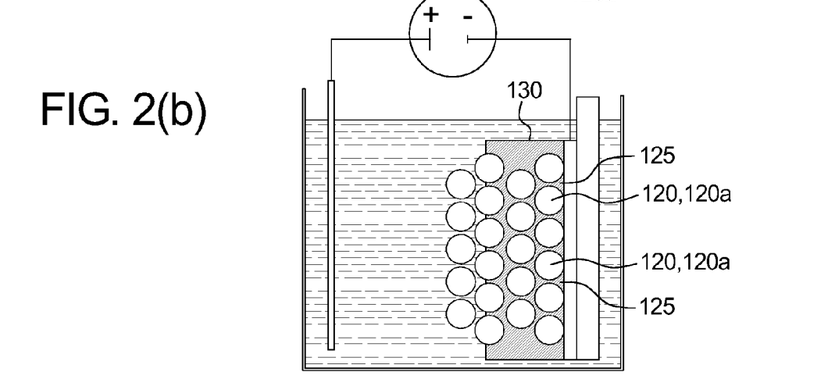

Interstices 125 of the lattice structure 120 are infiltrated with a conductive material 130, which may be a metal, alloy, semiconductor, or composite material including a conductive constituent. Referring to FIGS. 1(e) and 2(b), the conductive material 130 propagates through the interstices 125 of the lattice structure 120 in a direction away from the substrate 105 to reach a predetermined thickness and spans an area of the surface 105a overlaid by the conductive pattern 110.

Figure 1F:
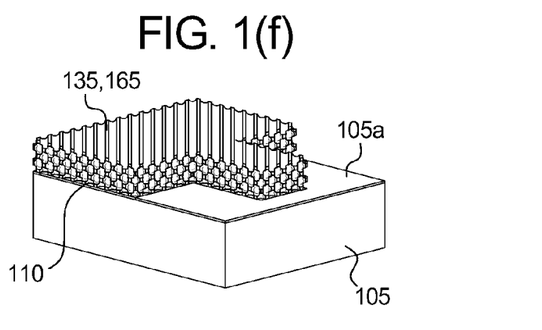
Figure 2C:
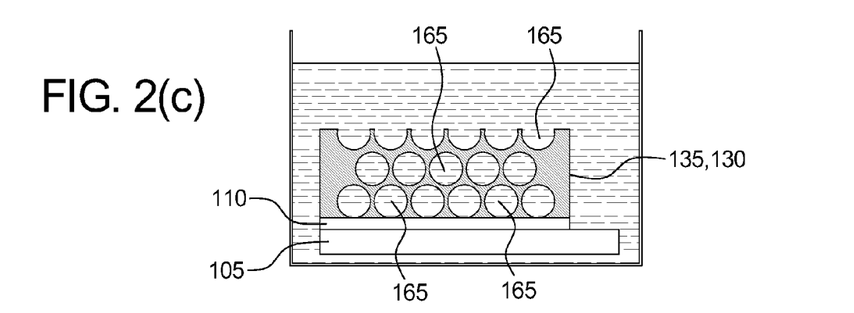
Figure 2D:
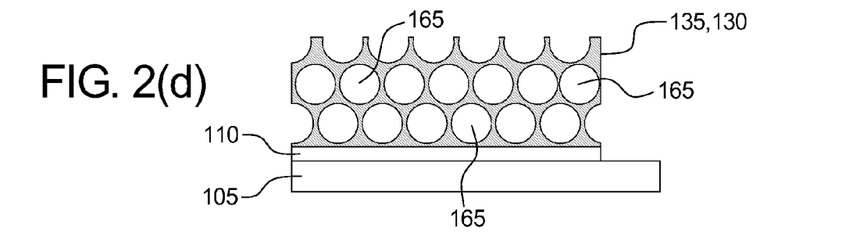

After the infiltration is carried out, the microparticles 120a are removed to form voids 165 in the conductive material 130 (see FIGS. 1(f) and 2(c)-(d)), thereby forming a conductive porous structure 135 of the predetermined thickness that has (a) a lateral size and shape defined by the underlying conductive pattern 110 and (b) an arrangement of voids 165 defined by the microparticles 120a that are removed. For example, spherical microparticles arranged in a close-packed cubic lattice lead to spherical voids of the same size and periodicity in the conductive porous structure. Such conductive porous structures may be referred to as "metal foams" due to the high volume fraction of porosity that may be achieved in these structures.

Figure 1G:
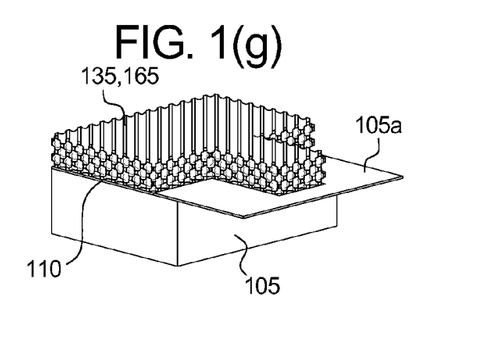
Figure 1H:
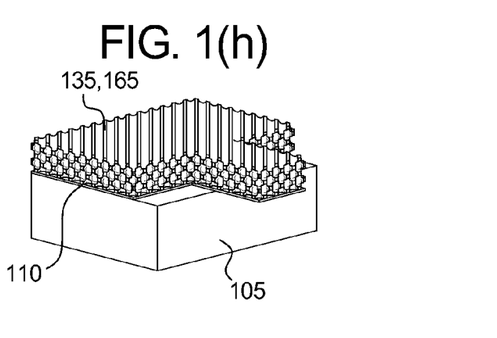
Figure 3A:
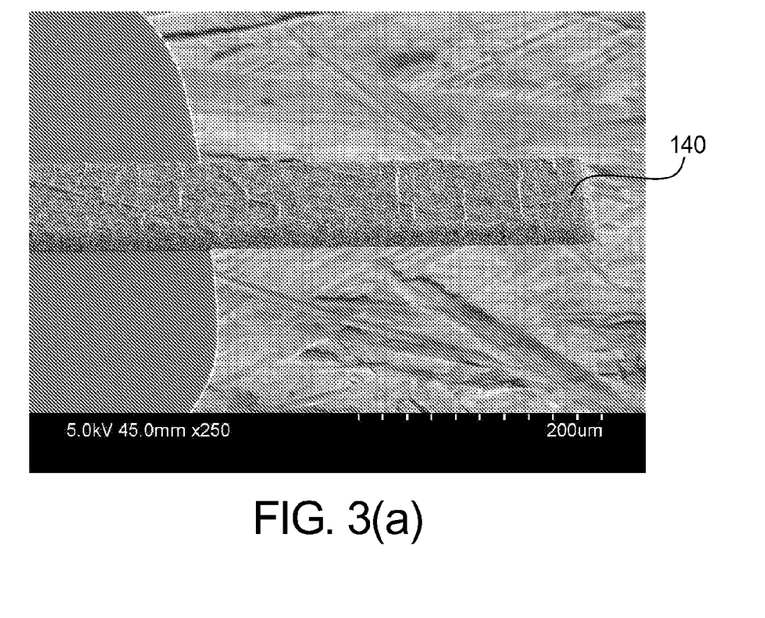
FIGS. 3(a)-3(c) are micrographs of an exemplary nickel porous cantilever at several magnifications.
Figure 3B:
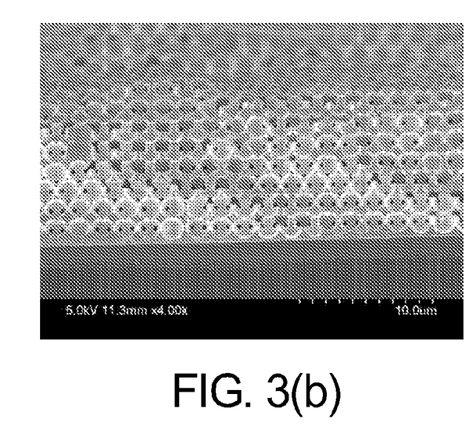
Figure 3C:
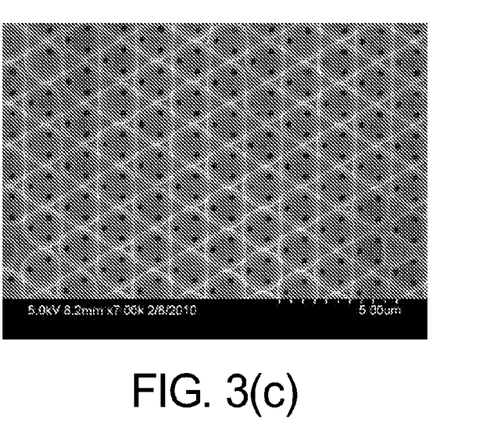

Finally, as indicated in FIGS. 1(g)-(h), the conductive porous structure 135 may be released from the substrate 105 via a backside etch process, and a three-dimensional porous device may be obtained. Micrographs of an exemplary nickel photonic crystal cantilever 140 are shown in FIGS. 3(a)-3(c), where FIGS. 3(b) and 3(c) provide higher magnification views showing the inverse opal microstructure. Besides cantilevers, other 3D devices are possible, including bridges, vertical structures, and other structures having 3D complexity including internal voids. Such devices may boast increased strength-to-weight ratios, higher thermal conductivity, and enhanced infrared properties compared to conventional micromechanical devices.

The 3D porous device may have dimensions ranging from tens to hundreds of microns in size (e.g., a width of about 100-200 microns, a length of about 300-400 microns, and a thickness of 10-20 microns in the case of an exemplary cantilever device) with a porosity on the microscale. For example, the size (average lateral dimension) of the voids typically ranges from about 0.1 micron to about 10 microns, from about 0.1 micron to about 5 microns, or from about 0.1 micron to about 2 microns, although larger or smaller sizes are also possible. The porous device may also be referred to as a microporous or macroporous device due to the size of the pores.

The conductive porous structure may have a porosity of from about 74% to about 99%, where porosity is defined as the volume fraction of voids (pores) and is expressed in terms of a percentage. A porosity ranging from about 74% to about 97%, from about 80% to about 97%, or from about 80% to about 95% is also possible. Typically, the voids are arranged in an ordered array that is defined by the lattice structure of microparticles. For example, the conductive porous structure may have an "inverse opal" structure.

The conductive pattern 110 may be formed on the surface 105a of the substrate 105 using photolithographic techniques known in the art. For example, a thermal $SiO_2$ layer 105a may be grown on a polished silicon wafer (the substrate 105) as shown in FIG. 1(b), a conductive film (e.g., a Cr/Au layer) may be deposited on the $SiO_2$, and then photoresist may be spun onto the conductive film. The wafer covered with photoresist may be aligned with a mask and then exposed and developed to transfer the mask pattern to the photoresist. Portions of the conductive film may be removed through the openings in the photoresist (e.g., by etching), and finally the remaining photoresist may be removed, leaving the conductive pattern 110 on the substrate 105, as shown in FIG. 1(c).

The deposition of the colloidal solution 115 and assembly of the microparticles 120a into the lattice structure 120 may be carried out by gravity sedimentation, vertical deposition, controlled drying, spin-coating, microfluidic assisted packing, tape casting, or a related process. The assembly of the microparticles 120a is primarily based on electrostatic repulsive interactions until the microparticles 120a undergo hard-sphere contact and form the final ordered lattice structure 120. If these electrostatic interactions are disrupted, the microparticles may aggregate together or, in the presence of a surface, the particles may attach to the surface in a disordered fashion. To achieve the desired ordered lattice structure across the entire surface (both patterned and unpatterned portions), the inventors recognized that the patterned and unpatterned portions of the surface can be engineered to have a similar surface charge, that is, the same sign of charge and preferably a similar magnitude of charge. Absent such surface engineering, disordered structures may form after the colloidal solution is deposited onto the surface, particularly at interfaces between the conductive pattern and the unpatterned portion of the surface.

To modify the surface to control the surface charge before the colloidal solution is deposited, the surface may be functionalized, which may entail attaching molecules to at least one of the unpatterned and patterned portions of the surface. If, for example, polystyrene microparticles are employed, the surface may be negatively charged to match the sulfate group on the microparticle surface. If the surface of the substrate comprises silica, which is highly negative, and the conductive pattern comprises gold, which is nearly neutral, the surface functionalization may entail attaching sodium 3-mercapto-1-propanesulfonate molecules to the conductive pattern to render the gold negatively-charged, along with the unpatterned portion of the surface and the microparticles. Any molecule that can both attach to the gold surface and render the gold surface negatively charged can be used. Many molecules that contain, for example, thiol groups to bind to the gold and either sulfonate and carboxylate groups to provide the surface charge will serve this purpose. More generally, if the surface charge of the surface or at least one region of the surface needs to be modified, a molecule that both attaches to that surface and provides the correct surface charge is suitable. During the subsequent infiltration step, it is believed that the molecules migrate to the top surface of the conductive material or are otherwise removed from the interface between the conductive pattern and the conductive material. It is also possible to functionalize the surface without using molecules; for example, oxidation may be employed or ultra-thin layers of one or more inorganic compounds may be deposited.

Referring again to FIG. 2(b), the infiltration of the conductive material 130 can be achieved by an electroplating (electrodeposition) process using the conductive pattern 110 as an electrode. The conductive material 130 forms near the conductive pattern 110 and moves through the interstices 125 of the lattice structure 120, with growth occurring substantially along a plane moving in a single direction normal to the substrate 105. The electroplating time determines the extent of infiltration and the thickness of the conductive porous structure 135 that is ultimately formed. Typically, the electroplating time is between about 3 hours and 7 hours to form a conductive porous structure of between about 5 μm and 10 μm in thickness. The electrodeposition process may be carried out from solution, or using ionic liquids. The resulting conductive material 130 is a three-dimensionally interconnected (monolithic) solid that is generally characterized by a high density and uniformity. Alternatively, it may be possible to employ chemical vapor deposition (CVD), physical vapor deposition (PVD), atomic layer deposition (ALD), sol-gel or another technique to carry out the infiltration if the deposited material can be confined to the conductive pattern.

In general, the conductive material may contain any material that can be electrodeposited. Metals or semiconductors, such as Al, Si, Ti, V, Cr, Mn, Fe, Co, Ni, Cu, Zn, Ga, Ge, As, Se, Zr, Nb, Mo, Ru, Rh, Pd, Ag, Cd, In, Se, Sn, Sb, Te, Hf, Ta, W, Re, Os, Ir, Pt, Au, Tl, Pb, or Bi, as well as alloys and compounds of these elements (e.g., CdSe), may be employed. The conductive material resulting from the electrodeposition may be transformed by chemical reaction; for example, a metal may be reacted with oxygen to form the corresponding oxide (e.g., ZnO, $Cu_2O$), or reacted with sulfur (or $H_2S$) or a halogen to form the corresponding sulfide or halide (e.g., CdS).

Removal of the microparticles after infiltration of the conductive material can be accomplished by burn-out, chemical dissolution or a related method, depending on the type of microparticles employed. For example, polystyrene and other organic polymer lattice structures may be removed by heating (e.g., at a temperature of at least 250° C.) or by dissolving with an organic solvent. Inorganic microparticles may be removed by an etchant; e.g., silica microparticles may be exposed to HF. Other techniques are also possible, such as irradiation or plasma-assisted etching of the lattice structure.

The resulting conductive porous structure may be released from the substrate (e.g., a carrier wafer) via backside etch, as discussed in the examples, to form a photonic crystal device such as a porous metal cantilever. The conductive porous structure may also be used as a template for additional fabrication steps and/or the method may be varied to create more complex devices.

For example, after removing the microparticles and forming the conductive porous structure, a portion of the conductive material may be removed from the voids to expand the voids, thereby increasing the porosity of the structure. The removal may be achieved by chemical etching, electropolishing (electrochemical etching), or anodization followed by chemical etching. As described above, a conductive porous structure formed from a close packed cubic lattice structure may have a porosity of 74%; this can be increased to 75% or larger, for example 74-99%, including 80%, 82%, 85%, 90%, 95%, and 97% by, for example, electrochemical etching.

Figure 4A:
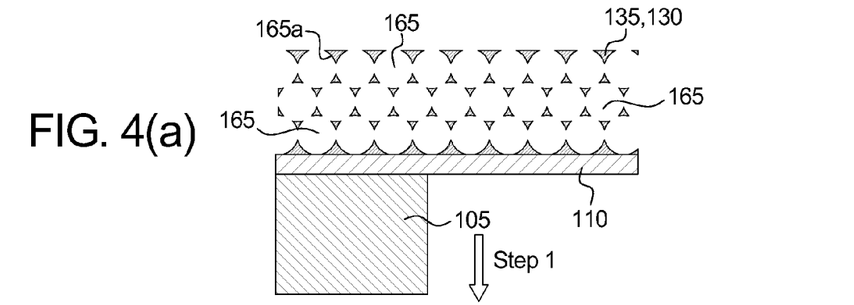
FIGS. 4(a)-4(c) are schematics showing the deposition of a layer of additional material into the voids of a conductive material (step 1) followed by the removal of the conductive material (step 2) to yield a thin framework of the additional material.
Figure 4B:
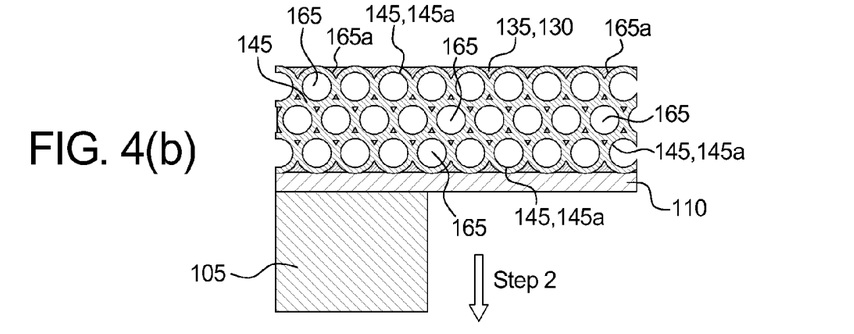

Referring to FIGS. 4(a)-4(b), the porosity of the conductive porous structure 135 may alternatively be decreased by directing additional material 145 into the voids 165 so as to deposit one or more layers 145a of the additional material 145 onto the conductive material 130, thereby partially filling the voids 165 of the conductive porous structure 135. The additional material 145 may be the same as or different from the conductive material 130, and may be deposited by electrodeposition or another technique, such as ALD or CVD. Using an appropriate deposition technique, the layer(s) of additional material 145 may form a conformal coating 145a over substantially all of the void surface 165a, as shown schematically in FIG. 4(b). The thickness of the conformal coating 145a may range from a few nanometers to a few hundred nanometers (e.g., between about 2 nm and about 200 nm) and is preferably uniform over the void surface 165a. Exemplary additional materials 145 include alumina ($Al_2O_3$), aluminum nitride, titanium dioxide, hafnium dioxide, silicon, and other materials that can be deposited as a thin coating.

Figure 4C:
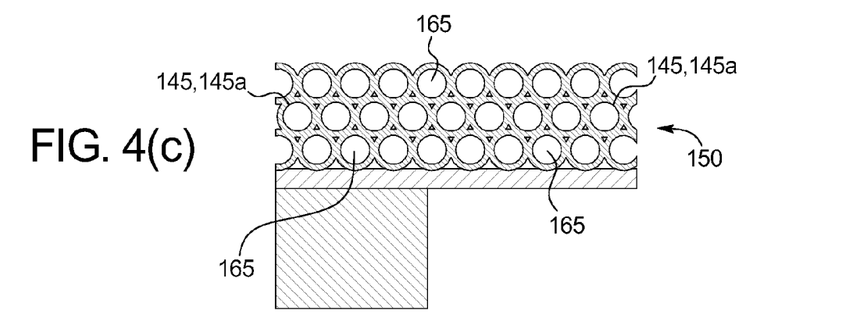

It is further possible to fabricate a thin scaffold or framework 150 based on the one or more layers 145a of additional material 145 deposited within the voids 165. To create such a framework 150, substantially all of the conductive material 130 may be removed after the layer(s) 145a of additional material 145 have been deposited, as shown schematically in FIG. 4(c). The removal may be carried out by selectively etching the conductive material 130 using an etchant that does not etch the additional material 145. The resulting hollow particle framework 150 of additional material 145 comprises a periodicity defined by the original lattice structure of microparticles and a thickness defined by the layer(s) 145a of additional material 145 deposited within the voids 165. The morphology of the hollow particle framework is defined by the void surfaces 165a, which act as a mold for the additional material 145. Accordingly, the exemplary 3D photonic crystal device formed in this manner may be described as a molded three-dimensional framework of interconnected hollow particles. Advantageously, the hollow particles may be arrayed in a periodic arrangement.

Figure 5A:
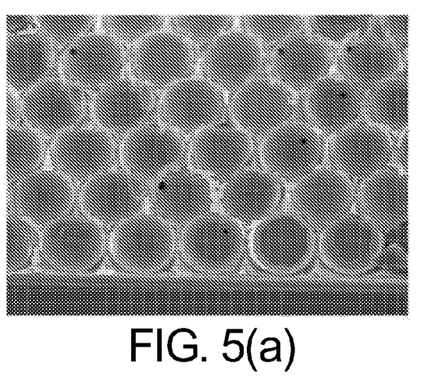
FIG. 5(a) is a scanning electron microscope (SEM) image showing an exemplary conductive porous structure after the additional material (aluminum oxide) is deposited but before the conductive material (nickel) is removed; the SEM image of FIG. 5(b) shows the resulting aluminum oxide framework after removing the conductive material (nickel) by etching.
Figure 5B:
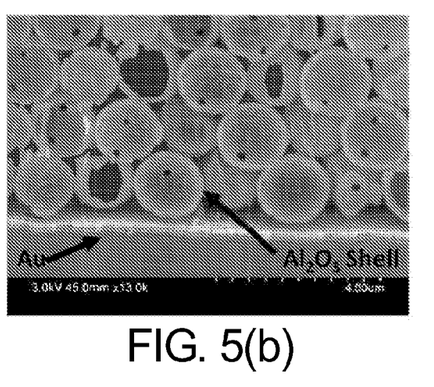

In one example, an aluminum oxide layer may be deposited within the voids of a conductive porous structure formed of nickel, and then the nickel may be removed using a commercial nickel etchant, leaving behind an aluminum oxide framework or "shell." FIG. 5(a) is a scanning electron microscope (SEM) image showing the conductive porous structure after the additional material (aluminum oxide) is deposited but before the conductive material (nickel) is removed. The SEM image of FIG. 5(b) shows the resulting aluminum oxide shell after removing the nickel by etching for seven hours in a commercial Ni etchant.

Figure 6A:
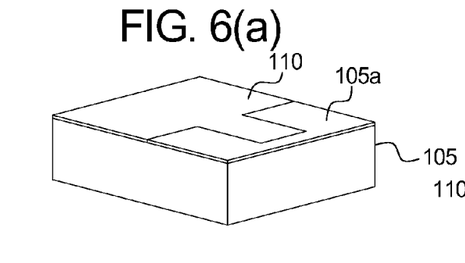
FIGS. 6(a)-6(f) are schematics showing fabrication of an exemplary conductive porous structure including a plurality of conductive materials.
Figure 6B:
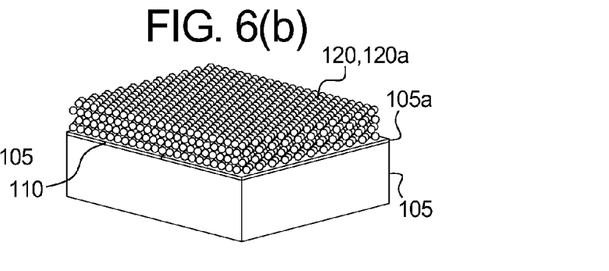
Figure 6C:
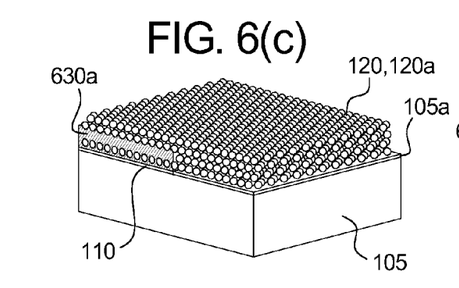
Figure 6D:
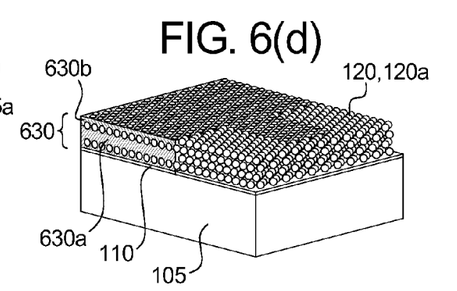
Figure 6E:
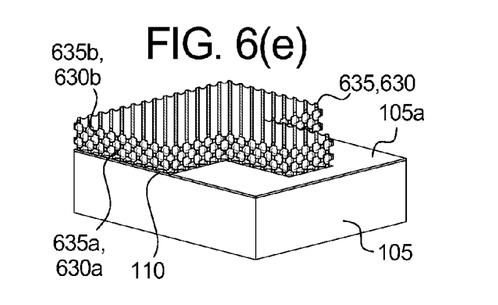
Figure 6F:
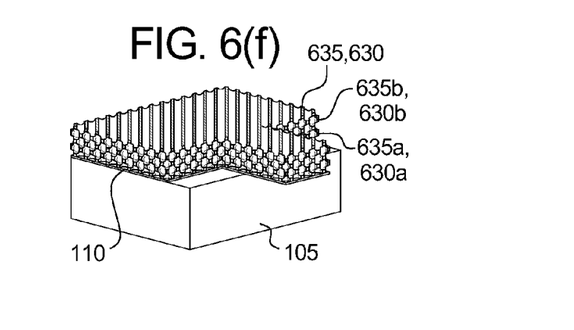
Figure 7:
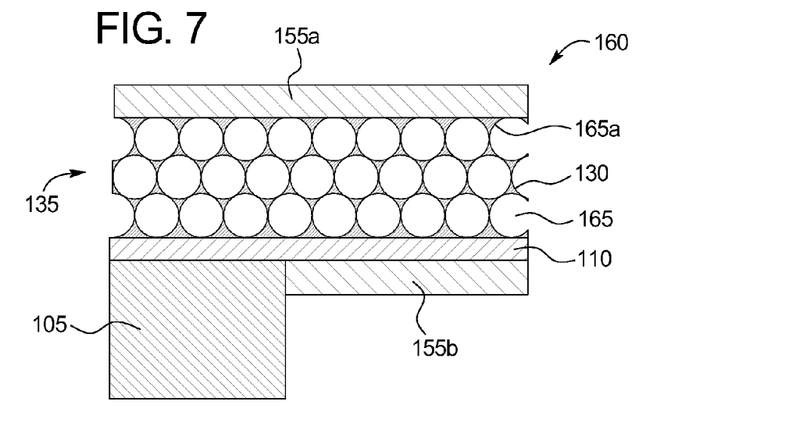
FIG. 7 shows a "corrugated cardboard" structure that includes a conductive porous structure sandwiched between solid top and bottom layers.

In another variation of the method, the conductive material that makes up the conductive porous structure may include more than one material, such as a first conductive material and a second conductive material, to produce a structure including multiple conductive layers in the direction of the device thickness. Referring to FIGS. 6(a)-6(f), the conductive porous structure 635 may be formed by infiltrating the interstices 125 of the lattice structure 120 with the first conductive material 630a (e.g., Au) to a first thickness, as shown in FIG. 6(c), and then with the second conductive material 630b (e.g., Ni) to a second thickness, as shown in FIG. 6(d), where the thickness of the resulting conductive porous structure 635 is equal to the sum of the first and second thicknesses. In general, the conductive material 630 may include a plurality of conductive materials up to an $n^{th}$ conductive material, where n is an integer and each conductive material is stacked on the previously deposited conductive material. After depositing all of the conductive materials 630, the microparticles 120a may be removed as described previously to yield the conductive porous structure 635 having multiple conductive layers 635a, 635b in the direction of the device thickness.

Figure 8A:
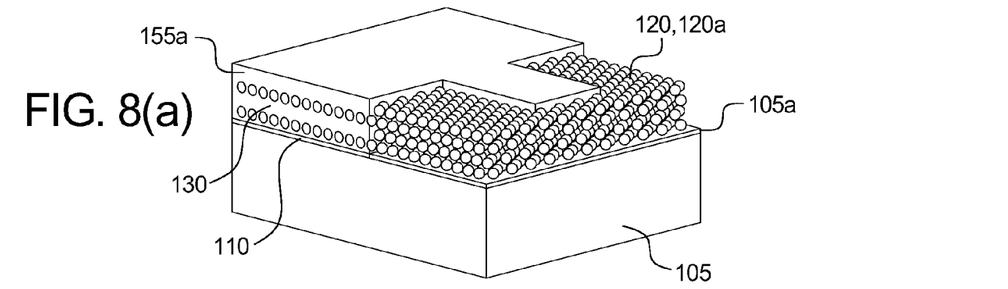
FIGS. 8(a)-8(e) are schematics showing exemplary steps in the fabrication of the "corrugated cardboard" structure of FIG. 7.
Figure 8B:
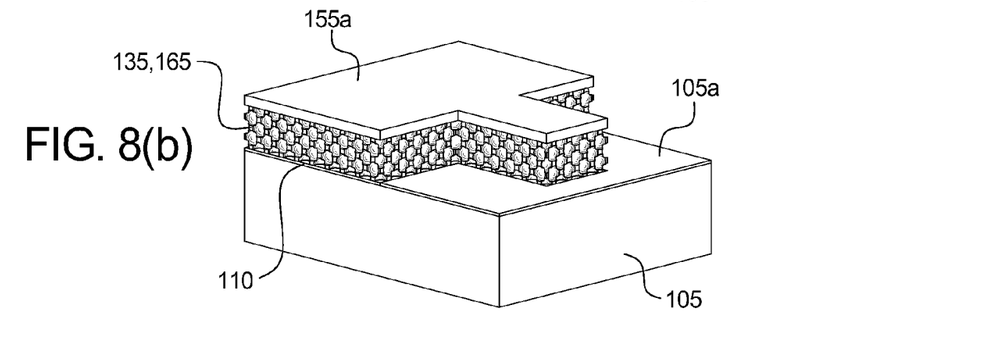
Figure 8C:
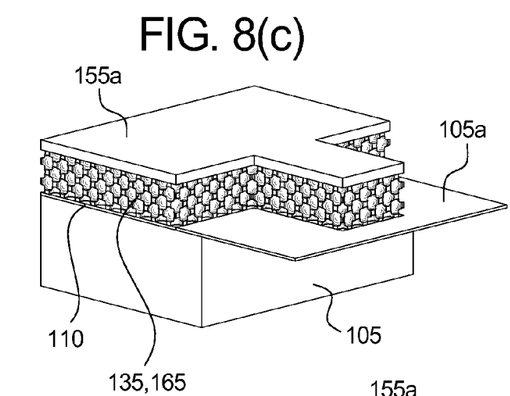
Figure 8D:
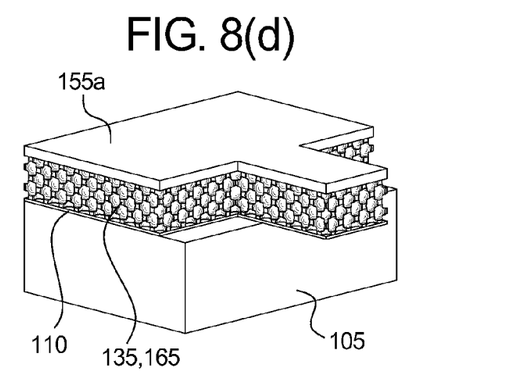
Figure 8E:
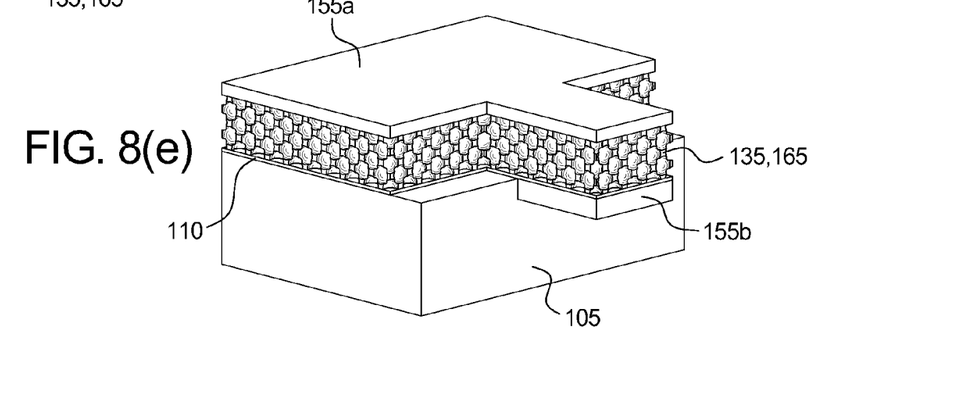
Figure 9A:
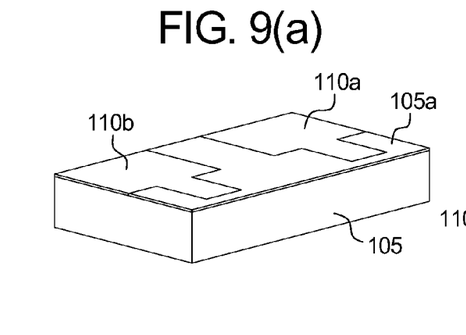
FIGS. 9(a)-9(g) are schematics showing exemplary steps in the fabrication of two conductive porous structures, each on a different conductive pattern.
Figure 9B:
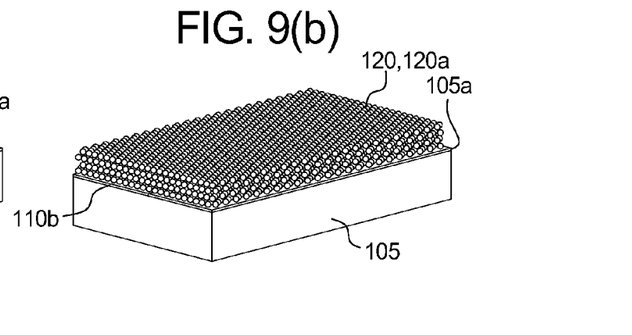
Figure 9C:
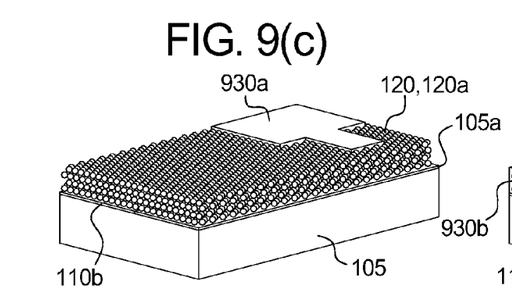
Figure 9D:
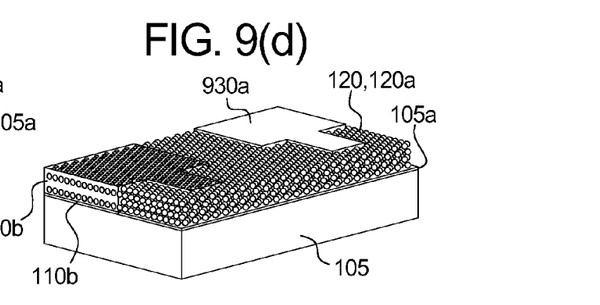
Figure 9E:
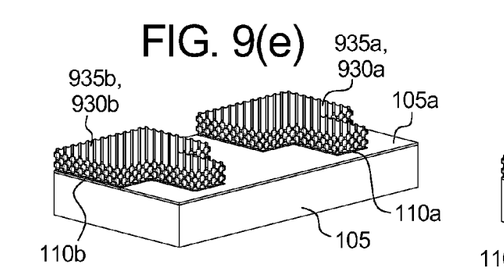
Figure 9F:
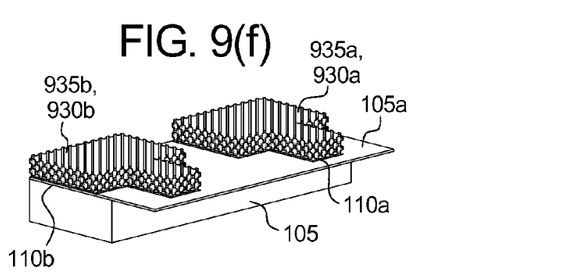
Figure 9G:
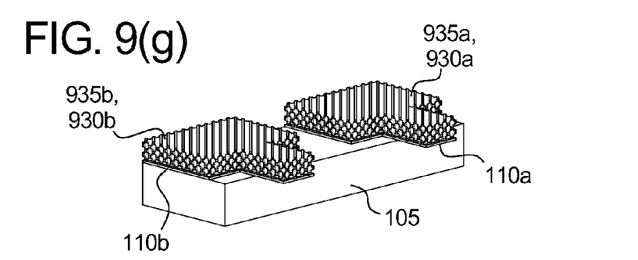

The processing steps may also include forming a solid layer of material on one or more selected surfaces (e.g., a top surface) of the lattice structure. The solid layer may be formed after infiltrating the interstices with the conductive material but before removing the microparticles. Because the solid layer is deposited before the microparticles are removed, the layer does not penetrate the voids of the conductive porous structure but rather forms a cap layer over the selected surface. Referring to FIG. 7 and FIGS. 8(a)-8(e), a corrugated cardboard structure 160 having an extremely high strength-to-weight ratio may be formed by sandwiching the conductive porous structure 135 between top and bottom solid layers 155a, 155b. The solid layer(s) 155a, 155b may range in thickness from about 20 nm to about 5 microns, however thinner and thicker solid layers are possible, and may be formed of any material that can be deposited via electrodeposition, physical vapor deposition, chemical vapor deposition, or another coating technique known in the art. To form a solid layer 155b on the bottom surface of the infiltrated lattice, a portion of the substrate 105 may first be removed (e.g., by etching) to expose an underside of the conductive pattern 110, and then the solid layer of material 155b may be formed on the underside of the conductive pattern 110, as shown in FIGS. 8(d)-8(e). In this case, the microparticles 120a may be removed from the conductive material 130 before (or after) depositing the solid layer 155b.

In another variation of the method, the substrate may be patterned to include multiple conductive patterns thereon to facilitate forming a number of conductive porous structures made of the same or different materials. The photolithographic techniques described above may be employed to create of multiple conductive patterns on the substrate, and different materials may be electrodeposited on different patterns. (Here, "different patterns" means distinct or separate patterns, as the different patterns may have the same dimensions and shape.) Referring, for example, to FIGS. 9(a)-9(g), nickel 930a may be electroplated on the gold pattern 110a on the right and copper 930b may be electroplated on the gold pattern 110b on the right. Each of the conductive materials (in this case, nickel 930a and copper 930b) spans an area of the substrate 105 overlaid by one of the conductive patterns 110a, 110b and propagates through the interstices 125 of the lattice structure 120 in a direction away from the substrate 105 to reach a thickness determined by the electroplating time. As when the electrodeposition is done with only a single conductive material 130, the microparticles 120a are removed after the infiltration step to form voids 165 in each of the conductive materials 930a, 930b deposited, thereby forming a plurality of conductive porous structures 935a, 935b.

Described in detail below are experiments to fabricate and test a porous nickel cantilever using the method set forth in this disclosure.

EXAMPLE 1

Fabrication of a Porous Nickel Cantilever

The process starts with the photodefinition of a metal seed layer onto a silicon substrate. A double side polished 4" silicon wafer (1-0-0, 400 microns thick) may be used as the substrate. A dry thermal oxide layer of 300 nm in thickness is grown on the silicon substrate (e.g., in a tube furnace for 5.5 hr at 1100° C.) prior to sputtering a 10 nm layer of Cr and a 40 nm layer of Au. The Cr/Au layer is then patterned. This involves spinning Shipley 1827 photoresist onto the wafer at 3000 rpm, soft baking at 120° C. for 2 minutes, exposing in an EV420 mask aligner for 20 sec, and developing in MF319 for 80 sec. A hard bake at 110° C. for 10 min and a wet etch in Au etchant for 20 sec and in Cr etchant for 10 sec follows. The photoresist is then removed after a 10 min soak in acetone and a 2 min exposure to an $O_2$ plasma, and the wafer may be manually diced into smaller (e.g., 1 cm×3 cm) pieces that each include a desired portion of the overall conductive pattern and which serve as substrates for the next part of the process.

A regular array of polystyrene (PS) microspheres is then created on the substrate(s) using a self assembly process. The PS microspheres are about 2 μm in diameter in this example and stack in a regular cubic lattice. Nickel is then electroplated from the metal seed layer, through the PS opal template (lattice structure), such that the nickel fills the spaces (interstices) between the PS spheres. After electroplating, the PS spheres are sacrificed via wet etching using tetrahydrofuran (THF), leaving a nickel microstructure that is the inverse of the cubic lattice of PS spheres (hence the origin of the name "inverse opal"). The resulting nickel MEMS device has the lateral size and shape of the metal seed layer, a thickness based on the electroplating, and a porous microstructure based on the originally assembled PS spheres.

After forming the porous device, an oxide film of about 1.5 microns in thickness is deposited on the chip using PECVD. The PECVD oxide layer seals small holes in the sample surface to facilitate subsequent patterning and release steps. Photoresist (e.g., AZ4620) is spun onto the front side of the chip and is hardbaked for 10 min at 120° C. The oxide is then removed from the backside with a 3.5 min buffered oxide etch (BOE) dip. Photoresist is spun at 1000 rpm onto the backside of the wafer and is softbaked at 115°

C. for 5 min, exposed in EV420 for 25 sec, and developed in AZ 400K (1:2 in dionized water) for 1 min, followed by hardbaking at 110° C. for 10 min. Photoresist is spun on a 4" single side polished wafer (carrier wafer), and the chip is manually attached to the carrier wafer and hardbaked at 120° C. for 15 min. An inductively coupled plasma (ICP) etcher is used to etch through the carrier wafer from the backside, and then the carrier wafer including the chip is soaked in a photoresist stripper (e.g., AZ 400T) at 80° C. until the chip can slide off the carrier wafer by itself. The chip may be soaked in the photoresist stripper for another 2 hr at 80° C. and then soaked in clean DI water for 5 min. The device is dried on a hotplate, cleaned in an oxygen plasma for 2 min, and released by dipping into HF for 20 sec. The device is again soaked in clean DI water for 5 minutes (water is changed partway through), and the device is dried on a hotplate. Good devices may then be manually snapped out of the chip.

EXAMPLE 2

Characterization of a Porous Cantilever

Figure 10A:
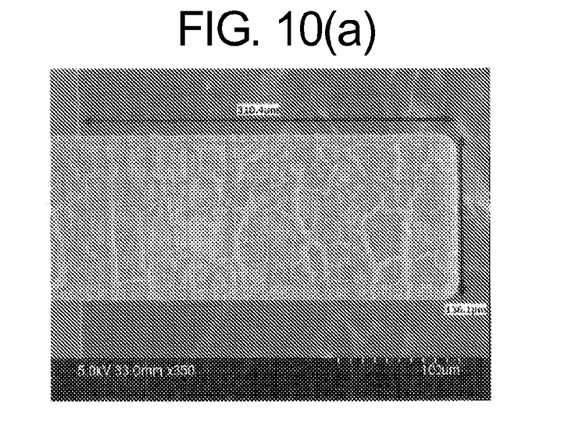
FIGS. 10(a)-10(c) show SEM images of an exemplary final released microcantilever.
Figure 10B:
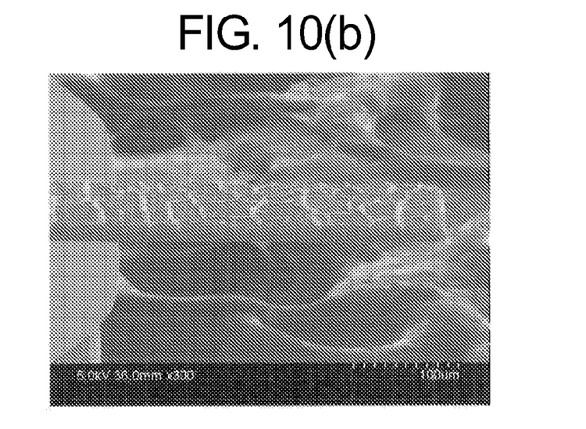
Figure 10C:
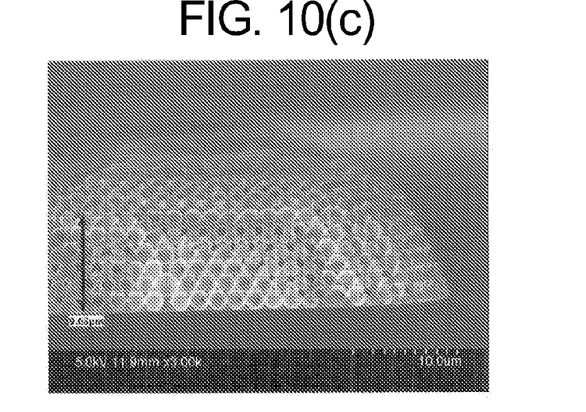
Figure 10D:
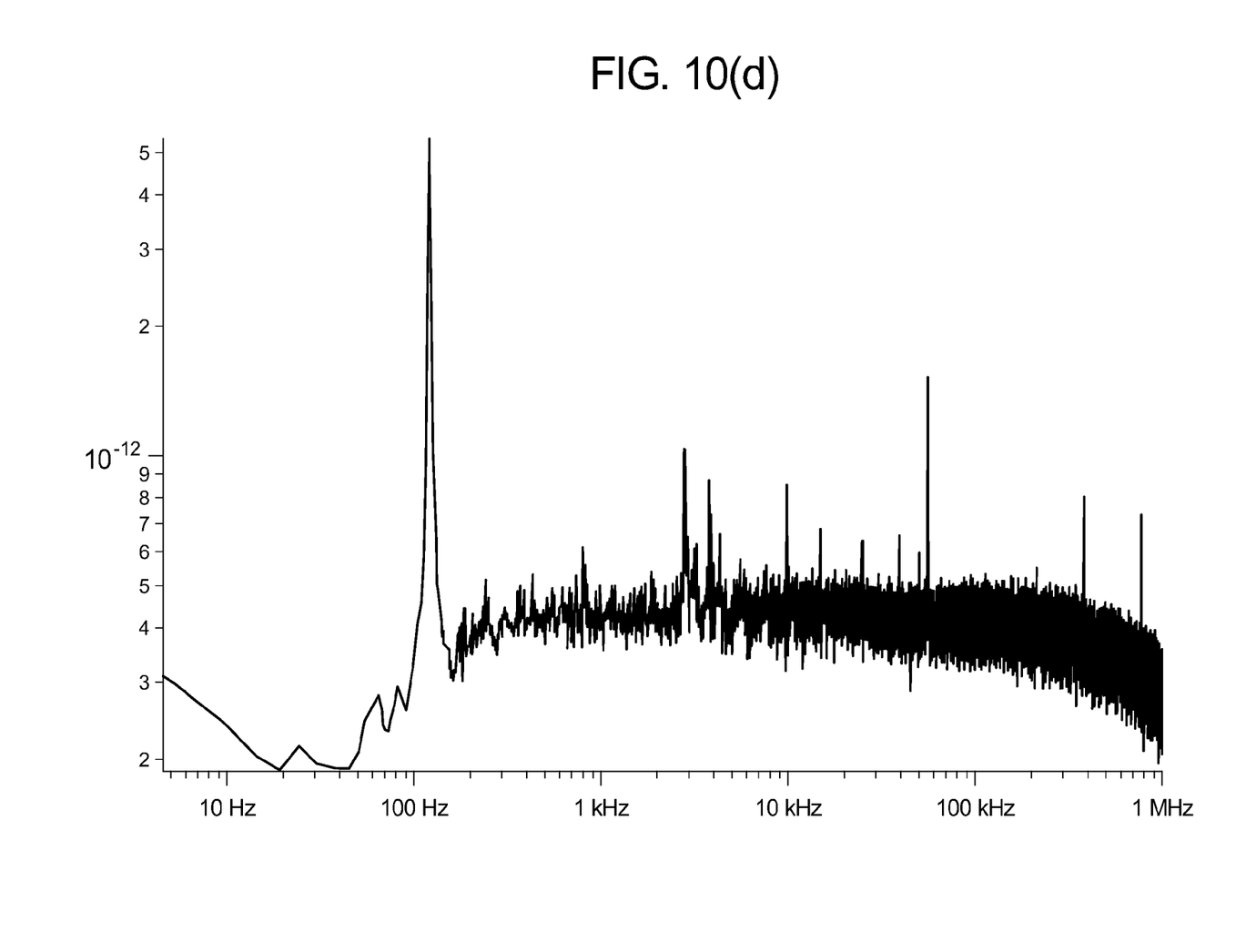
FIGS. 10(d)-10(f) shows AFM and nanoindentation data obtained for the microcantilever of FIGS. 10(a)-10(c)
Figure 10E:
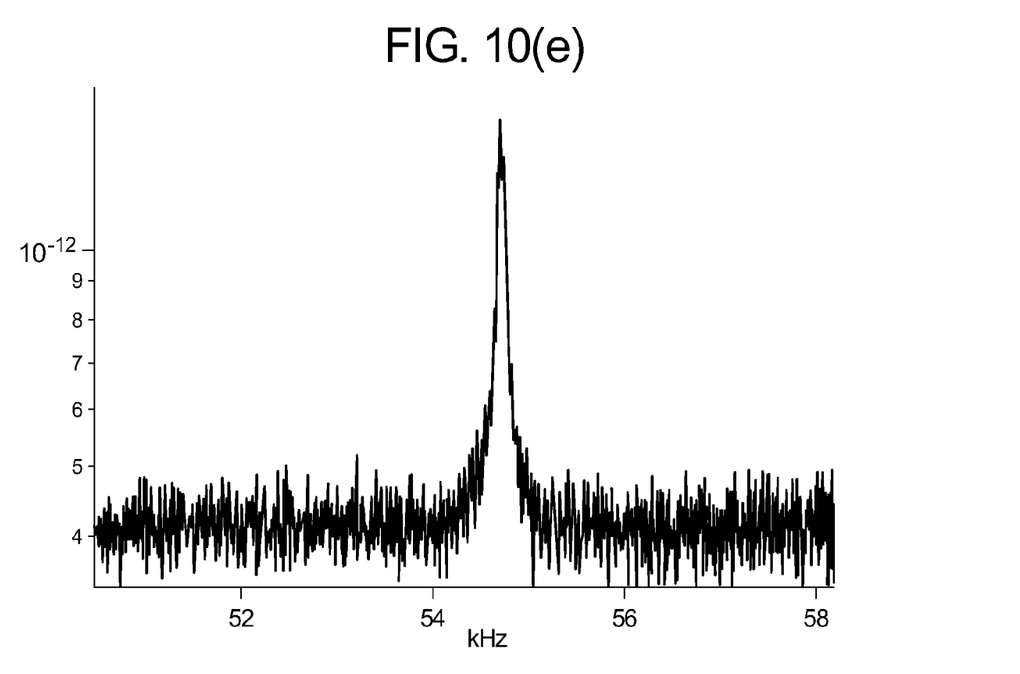
Figure 10F:
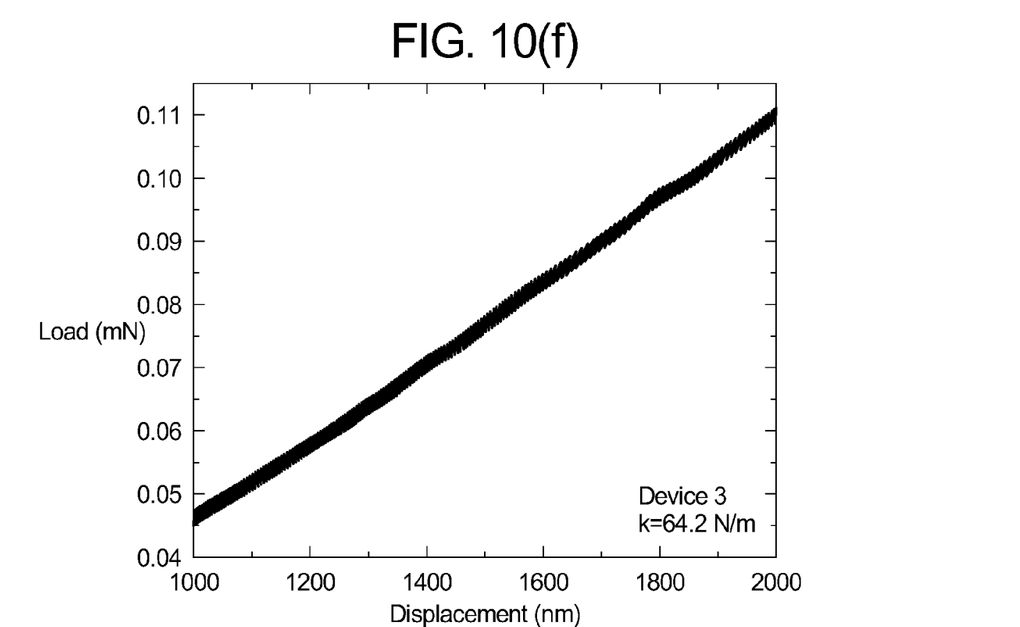

FIGS. 10(a)-10(c) show scanning electron microscope (SEM) images of a final released cantilever, including top and side views. The inverse opal microstructure produces a regular monodisperse porosity that extends through the extent of the cantilever in three dimensions. The mechanical properties of the cantilevers can be evaluated using atomic force microscopy (AFM) and nanoindentation. AFM and nanoindentation data are shown in FIGS. 10(d)-10(f). For this exemplary device (length about 310 µm, width about 136 µm, thickness about 10 µm), the resonant frequency was determined to be about 55 kHz, the spring constant was determined to be about 17 N/m by AFM (about 64 N/m using nanoindentation), and the quality factor is about 660. For a cantilever of length about 350 µm, width about 120 µm, and thickness about 10 µm, a typical spring constant is about 20 N/m, resonant frequency is about 40 kHz, and quality factor is about 800. This quality factor is one order of magnitude higher than similarly-sized silicon cantilevers.

Figures 11, 12A, 12B:
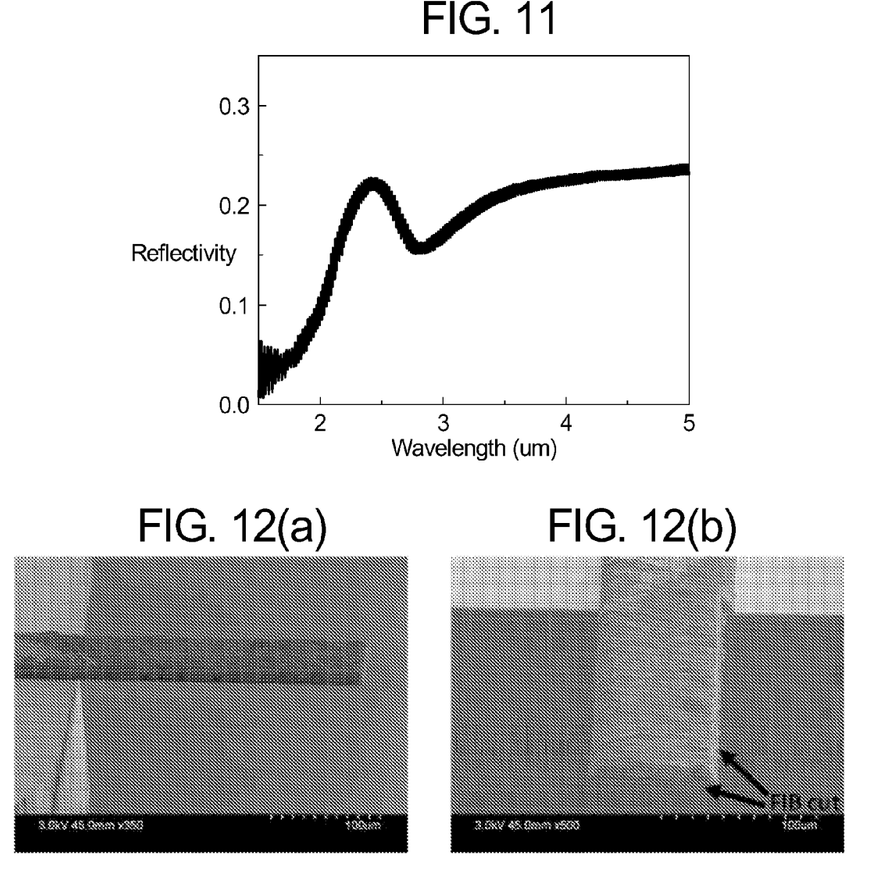
FIG. 11 shows Fourier transform IR measurements (FTIR) obtained for an exemplary nickel microcantilever.
FIGS. 12(a)-12(d) show SEM images of a cantilever "shell" structure comprising $Al_2O_3$.
Figure 12C:
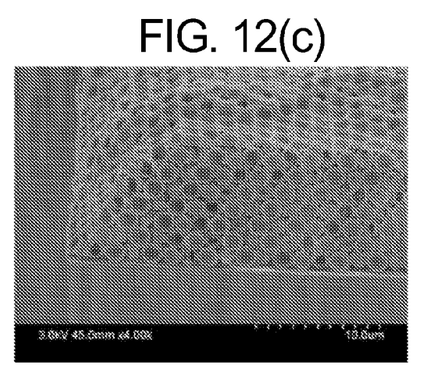
Figure 12D:
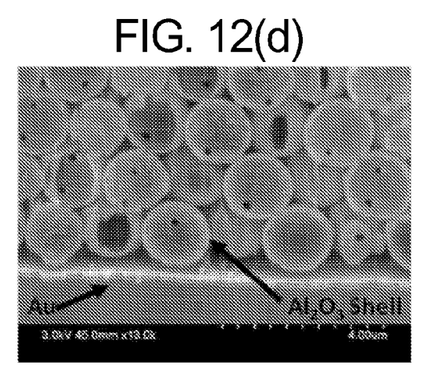

Some applications of this type of photonic crystal device exploit its unusually low infrared reflectivity. FIG. 11 shows Fourier transform IR (FTIR) measurements on the nickel microcantilever, showing reflectivity close to 0.2 compared to the typical value for electroplated nickel at 0.6. The photonic crystal structure provides for much lower reflectance than can be achieved with electroplated nickel.

EXAMPLE 3

"Shell Structure" Device Fabrication

As described above, the porous nickel cantilevers can be used as templates for additional fabrication steps. In this example, using atomic layer deposition (ALD), a porous nickel cantilever is coated with 75 nm thick $Al_2O_3$. A focused ion beam (FIB) is used to cut the cantilever edge to expose the nickel, and then the devices are soaked in nickel etchant until only the $Al_2O_3$ shell remains. FIGS. 12(a)-12(d) show the resulting cantilever structure, including its cross-section. Because of the thin $Al_2O_3$, such a structure has a volume fraction close to 1%.

EXAMPLE 4

Devices with Multiple Metal Layers

The electrochemical process may be controlled to obtain multiple layers of conductive material in the direction of the device thickness, as described above. Referring again to FIGS. 6(a)-6(f), a first conductive material 630a may be electroplated (for example Au), and then a second conductive material 630b (for example Ni) may be plated on top of the first conductive material 630a. The thickness of each layer of material is controlled by the electroplating time, where longer times lead to greater thicknessses.

Figure 13A:
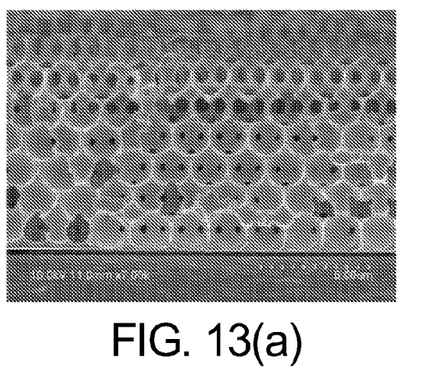
FIGS. 13(a)-13(b) show SEM images of an exemplary porous cantilever fabricated with two layers of metal (Au, bottom; Ni, top)
Figure 13B:
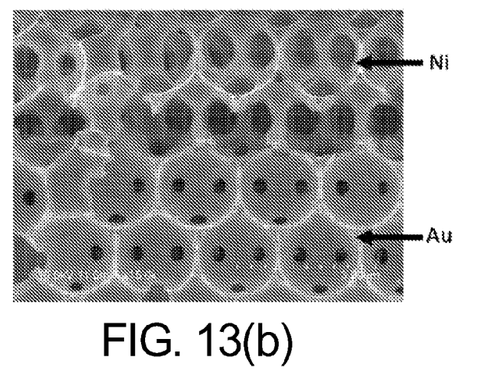

FIGS. 13(a)-13(b) show SEM images of an exemplary porous cantilever fabricated with two layers of metal (Au, bottom; Ni, top). Since the Au and Ni cannot be distinguished very well in SEM, the Ni foam is electrochemically etched to make it more porous. The Au layer is not affected by the etching. In the SEM images, it can be seen that the top Ni layers have much bigger holes. The Ni layer has a thickness equivalent to two opal layers and the bottom Au layer has a thickness equivalent to four opal layers.

EXAMPLE 5

Surface Functionalization

The substrate and the conductive pattern may be engineered to have the same or a similar surface charge to promote the assembly of a uniform close-packed lattice structure of microparticles, as described above. In particular, the surface may be functionalized to control the sign and magnitude of the surface charge.

Figure 14A:
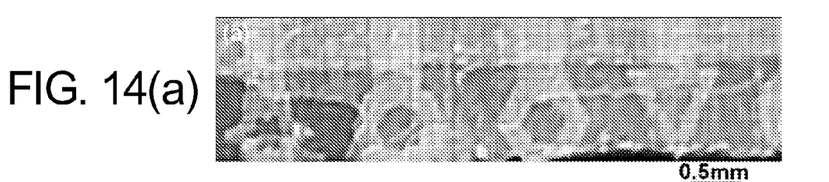
FIGS. 14(a)-14(b) show optical photos of opal growing on a patterned substrate with a functionalized and non-functionalized surface, respectively.
Figure 14B:
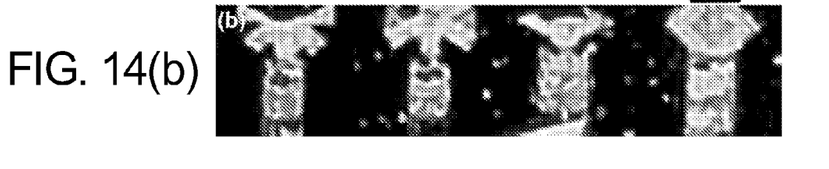
Figure 15A:
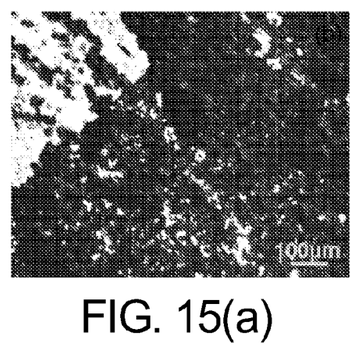
FIG. 15(a) is a micrograph showing disordered and discontinuous aggregates formed on an untreated surface.
Figure 15B:
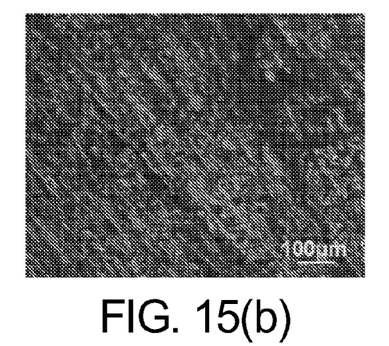
FIG. 15(b) is a micrograph showing a close-packed opal crystal formed on a uniformly charged surface.

If, for example, sulfate polystyrene beads are used as the microparticles, the surface may be negatively charged to match the sulfate group on the bead surface. On a gold on silica (or oxidized silicon) patterned surface, the gold and silica may have very different surface charges. The silica substrate is highly negative, and the gold pattern is nearly neutral. To render the gold negative, the surface may be treated with sodium 3-mercapto-1-propanesulfonate. The thiol groups (mercapto group) in this molecule attach to the gold surface and expose sulfonate groups, giving the gold surface an effectively negative charge. If the microparticles are assembled on this surface, a continuous opal film is formed (FIG. 14(a)). On the initial untreated surface, the microparticles form a highly discontinuous lattice and tend to peel off (FIG. 14(b)). FIGS. 15(a) and 15(b) are higher magnification views of colloidal crystallization (microparticle assembly) on an untreated (a) and treated (b) surface.

Although the present invention has been described with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein. Furthermore, the advantages described above are not necessarily the only advantages of the invention, and it is not necessarily expected that all of the described advantages will be achieved with every embodiment of the invention.

The invention claimed is:
1. A method of making a three-dimensional porous micromechanical device, the method comprising:
providing a substrate having a conductive pattern on a surface thereof, the substrate comprising a patterned portion of the surface covered by the conductive pattern and an unpatterned portion of the surface not covered by the conductive pattern;
after providing the substrate, depositing a colloidal solution comprising a plurality of microparticles onto the surface of the substrate, the microparticles assembling into a lattice structure on the patterned and unpatterned portions of the surface;

infiltrating interstices of the lattice structure with a conductive material, the conductive material propagating through the interstices in a direction away from the substrate to reach a predetermined thickness and spanning an area of the surface overlaid by the conductive pattern;

removing the microparticles to form voids in the conductive material, thereby forming a conductive porous structure having the predetermined thickness and a lateral size and shape of the conductive pattern, and removing only a portion of the substrate to expose an underside of the conductive pattern, thereby forming the three-dimensional porous micromechanical device.

2. The method of claim 1, wherein the infiltrating comprises electrodepositing the conductive material using the conductive pattern as an electrode.

3. The method of claim 1, wherein, prior to depositing the colloidal solution, a difference in surface charge between the conductive pattern and the unpatterned portion of the surface is reduced.

4. The method of claim 3, wherein reducing the difference in surface charge entails attaching molecules to at least one of the conductive pattern and the unpatterned portion of the surface, thereby functionalizing the surface.

5. The method of claim 4, wherein the unpatterned portion comprises silica, the conductive pattern comprises gold, and the molecules comprise sodium 3-mercapto-1-propanesulfonate, the molecules being attached to the conductive pattern to render the gold negatively-charged.

6. The method of claim 1, wherein the conductive material comprises at least a first conductive material and a second conductive material on the first conductive material, the conductive material thereby comprising multiple conductive layers in the direction away from the substrate, the interstices of the lattice structure being infiltrated with the first conductive material to a first thickness and with the second conductive material to a second thickness.

7. The method of claim 6, wherein the conductive material includes multiple conductive materials up to an $n^{th}$ conductive material, where n is an integer of 3 or greater.

8. The method of claim 1, further comprising removing a portion of the conductive material from the voids to expand the voids of the conductive porous structure.

9. The method of claim 1, further comprising directing additional material into the voids to deposit one or more layers of the additional material onto the conductive material, thereby partially filling the voids of the conductive porous structure.

10. The method of claim 9, further comprising removing substantially all of the conductive material to form a hollow particle framework comprising the additional material.

11. The method of claim 9, wherein the one or more layers of additional material comprise a thickness of between about 2 microns and about 100 microns.

12. The method of claim 1, further comprising, after infiltrating the interstices and before removing the microparticles, forming one or more solid layers of material on a top surface of the lattice structure.

13. The method of claim 1, further comprising forming one or more solid layers of material on the underside of the conductive pattern.

14. The method of claim 1, wherein, prior to depositing the colloidal solution, the surface of the substrate is provided with a plurality of the conductive patterns thereon.

15. The method of claim 14, wherein the interstices are infiltrated with a plurality of conductive materials, each of the conductive materials spanning an area of the surface overlaid by one of the conductive patterns, and wherein the microparticles are removed to form voids in each of the conductive materials, thereby forming a plurality of the conductive porous structures.

16. The method of claim 1, wherein the three-dimensional porous micromechanical device comprises a structure selected from the group consisting of: cantilever and bridge.

* * * * *

UNITED STATES PATENT AND TRADEMARK OFFICE
CERTIFICATE OF CORRECTION

Page 1 of 1

PATENT NO. : 9,601,234 B2
APPLICATION NO. : 13/978453
DATED : March 21, 2017
INVENTOR(S) : William P. King et al.

It is certified that error appears in the above-identified patent and that said Letters Patent is hereby corrected as shown below:

In the Specification

In Column 1, Lines 10-11, after "The U.S. Government", replace "may have rights in this invention." with --has certain rights in this invention.--.

Signed and Sealed this
Nineteenth Day of September, 2017

Joseph Matal
*Performing the Functions and Duties of the*
*Under Secretary of Commerce for Intellectual Property and*
*Director of the United States Patent and Trademark Office*